(12) United States Patent
Goorden et al.

(10) Patent No.: US 11,409,206 B2
(45) Date of Patent: Aug. 9, 2022

(54) ALIGNMENT METHOD AND APPARATUS

(71) Applicant: ASML Netherlands B.V., Veldhoven (NL)

(72) Inventors: Sebastianus Adrianus Goorden, Eindhoven (NL); Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 16 days.

(21) Appl. No.: 17/049,597

(22) PCT Filed: Apr. 2, 2019

(86) PCT No.: PCT/EP2019/058220
§ 371 (c)(1),
(2) Date: Oct. 22, 2020

(87) PCT Pub. No.: WO2019/206579
PCT Pub. Date: Oct. 31, 2019

(65) Prior Publication Data
US 2021/0240091 A1 Aug. 5, 2021

(30) Foreign Application Priority Data
Apr. 26, 2018 (EP) .................................... 18169523

(51) Int. Cl.
*G03F 9/00* (2006.01)

(52) U.S. Cl.
CPC .......... *G03F 9/7046* (2013.01); *G03F 9/7088* (2013.01)

(58) Field of Classification Search
CPC .... G03F 9/7046; G03F 9/7073; G03F 9/7076; G03F 9/7084; G03F 9/7088; G03F 7/70775; G03F 7/70516
See application file for complete search history.

(56) References Cited

U.S. PATENT DOCUMENTS

| 6,636,311 B1 | 10/2003 | Ina et al. |
| 6,952,253 B2 | 10/2005 | Lof et al. |
| (Continued) | | |

FOREIGN PATENT DOCUMENTS

| JP | H10-185512 A | 7/1998 |
| JP | 2000-228356 A | 8/2000 |
| (Continued) | | |

OTHER PUBLICATIONS

International Search Report and Written Opinion of the International Searching Authority directed to related International Patent Application No. PCT/EP2019/058220, dated Jul. 11, 2019; 10 pages.

(Continued)

*Primary Examiner* — Peter B Kim
(74) *Attorney, Agent, or Firm* — Sterne, Kessler, Goldstein & Fox P.L.L.C.

(57) ABSTRACT

A method of determining a position of a feature (for example an alignment mark) on an object (for example a silicon wafer) is disclosed. The method comprises determining an offset parameter, determining the second position; and determining a first position from the second position and the offset parameter, the position of the mark being the first position. The offset parameter is a measure of a difference in: a first position that is indicative of the position of the feature; and a second position that is indicative of the position of the feature. The offset parameter may be determined using a first measurement apparatus and the second position may be determined using a second, different measurement apparatus.

13 Claims, 4 Drawing Sheets

(56) References Cited

U.S. PATENT DOCUMENTS

| | | |
|---|---|---|
| 6,961,116 B2 | 11/2005 | Den Boef et al. |
| 6,987,556 B2 | 1/2006 | Van Der Schaar et al. |
| 7,804,994 B2 | 9/2010 | Adel et al. |
| 2004/0257572 A1 | 12/2004 | Stacker |
| 2007/0233305 A1 | 10/2007 | Werkman et al. |
| 2008/0013089 A1 | 1/2008 | Ishii et al. |
| 2009/0195768 A1 | 8/2009 | Bijnen et al. |
| 2011/0317163 A1* | 12/2011 | Lee ................... G03F 9/7046 356/401 |
| 2015/0109624 A1 | 4/2015 | Kreuzer et al. |
| 2015/0153656 A1 | 6/2015 | Van Der Sanden et al. |
| 2015/0227061 A1 | 8/2015 | Tinnemans et al. |
| 2015/0261097 A1 | 9/2015 | Mathijssen et al. |

FOREIGN PATENT DOCUMENTS

| | | |
|---|---|---|
| JP | 2002-008974 A | 1/2002 |
| JP | 2005-518107 A | 6/2005 |
| JP | 2006-012867 A | 1/2006 |
| JP | 2013-042186 A | 2/2013 |

OTHER PUBLICATIONS

International Preliminary Report on Patentability directed to related International Patent Application No. PCT/EP2019/058220, dated Oct. 27, 2020; 8 pages.

"Inline calibration in order to correct for a first scan effect," Research Disclosure No. 535020, Nov. 2008; 4 pages.

* cited by examiner

Fig. 5 and mark (for example an alignment mark).

ALIGNMENT METHOD AND APPARATUS

CROSS REFERENCE TO RELATED APPLICATIONS

This application claims priority of EP application 18169523.0 which was filed on 2018 Apr. 26 and which is incorporated herein in its entirety by reference.

FIELD

The present invention relates to methods of determining a position of a feature on an object and associated apparatus for carrying out these methods. The object may be a substrate (for example a silicon wafer) and the feature may be a mark (for example an alignment mark).

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In order to control the lithographic process to place device features accurately on the substrate, alignment marks are generally provided on the substrate, and the lithographic apparatus includes one or more alignment measurement systems by which positions of alignment marks on a substrate can be measured accurately. These alignment measurement systems are effectively position measuring apparatuses. Various different types of alignment marks and different types of alignment measurement systems are known. Generally, an alignment measurement system measures the position of an alignment mark by irradiating it with a measurement radiation beam, receiving at least a portion of the measurement radiation beam scattered from the alignment mark and determining a position of the alignment mark from this scattered radiation.

There is continually a need to provide more accurate position measurements, especially to control overlay errors as product features get smaller and smaller.

It is an object of the present invention to provide alternative methods and apparatus that are suitable for determining a characteristic of a feature in an object (for example the position of an alignment mark) which at least partially address one or more problems associated with prior art arrangements, whether identified here or not.

SUMMARY

According to a first aspect of the invention there is provided a method of determining a position of a feature, on an object, the method comprising: determining an offset parameter, the offset parameter being a measure of a difference in: a first position that is indicative of the position of the feature; and a second position that is indicative of the position of the feature; determining the second position; and determining the first position from the second position and the offset parameter, the position of the mark being the first position.

The object may be a silicon wafer and the feature may be a mark, for example, an alignment mark.

It will be appreciated that the first and second positions which are indicative of the position of the feature are absolute positions, for example relative to a reference position, for example as determined using two different techniques. Therefore, the first and second positions are in general dependent on a configuration of the object. Any deformation of the object may alter the configuration of the object and, in turn may alter the first and second positions. Deformation of the object may occur by, for example, clamping of the object substrate to a support (for example a substrate table) and/or heating of the object. It will be appreciated that the reference position relative to which the first and second positions are defined may be a position on the object or, alternatively, may be a position on a support for the object, such as a substrate table. It will be further appreciated that any deformation of the object over the distance between the reference position and the first and second positions will affect the determination of the first and second positions.

In contrast, the offset parameter is a relative position, being a measure of a difference in a first position that is indicative of the position of the feature and a second position that is indicative of the position of the feature. Therefore, although the offset parameter is in principle dependent on the configuration of the object (i.e. any deformations of the object), it is only dependent on deformations of the object over a distance scale of the offset parameter. In practice, the first and second positions may be sufficiently close that the offset parameter is sufficiently small such that over such distance scales deformations of the object may be insignificant. For example, in some embodiments, the first and second positions may both be positions of the feature (although may be as determined by different techniques). For such embodiments, the offset parameter may be significantly smaller than a dimension of the feature, and may for example be smaller than a pitch of the feature. The feature may be an alignment mark with a pitch of the order of 2 μm. Over such distance scales deformations of the object (for example a silicon wafer with a diameter of the order of 300 mm) may be insignificant. In other embodiments, the first position may be a position of the feature and the second position may be a position of another, relatively close feature. For such embodiments, the offset parameter is of the order of the separation between the two features. For a sufficiently small distance between the two features, deformations of the object (for example a silicon wafer with a diameter of the order of 300 mm) may be insignificant. Therefore, the offset parameter may be substantially independent of the configuration of the object (as may be dependent on any deformation of the object that may be caused, for example, by clamping of the object to a support).

The method according to the first aspect of the invention is advantageous because, since the offset parameter is a relative position (and therefore may be substantially independent of the configuration or deformation of the object), the offset parameter can be determined in a first apparatus and the second position may be determined in a second, different apparatus. For example, the offset parameter may be determined in a first metrology apparatus and the second position may be determined using a position measurement apparatus (for example an alignment sensor) within a lithographic apparatus. This ability to split a position measurement into two parts, which can be determined by different apparatuses is counter-intuitive since, as will be appreciated by the skilled person, each apparatus may clamp the object in a different way to a different support and will therefore, in general, cause a different configuration or deformation of the object.

This ability to split a position measurement into two parts, which can be determined by different apparatuses, may allow a more accurate position measurement to be determined within a second apparatus (for example a lithographic apparatus) using a less accurate measurement technique (in combination with the previously determined offset parameter).

Additionally or alternatively, it may allow the position of a feature to be determined inside a lithographic apparatus using a position measurement system (for example an alignment sensor) that cannot resolve the feature (but which can resolve another, nearby feature). Advantageously, this allows the size of features to be reduced. In turn, this may allow for features to be placed in a greater range of positions on the object. For example, typically alignment marks for lithography are located on silicon wafers in scribe lines disposed between adjacent dies. However, if the marks can be reduced in size sufficiently, it may be acceptable to provide marks within the dies themselves.

The offset parameter is a measure of a difference in: a first position that is indicative of the position of the feature; and a second position that is indicative of the position of the feature. However, it will be appreciated that the offset parameter may be determined directly. That is, in at least some embodiments, it may be that the determination of the offset parameter does not involve the determinations of the first and second positions. Alternatively, the offset parameter may be determined by first determining the first and second positions and then subsequently determining the offset parameter.

Furthermore, it will be appreciated that the first and second positions which are indicative of the position of the feature are absolute positions, for example relative to a reference position, for example as determined using two different techniques. Therefore, the first and second positions are in general dependent on a configuration of the object. It will be appreciated that the offset parameter may be determined in a first apparatus and the second position may be determined in a second apparatus and that, in general, the configuration of the object may differ in the first and second apparatus. Therefore, for embodiments wherein the offset parameter is determined by first determining the first and second positions and then subsequently determining the offset parameter, these first and second positions (which are determined in a first apparatus) will, in general, differ from the first and second positions which are determined in the second apparatus.

The first position may be a position indicative of the position of the feature that can be determined using a first technique and the second position may be a position indicative of the position of the feature that can be determined using a first technique. For example, the first technique may be more accurate than the second technique.

The offset parameter and the second position may be determined using any suitable position measuring sensor. Suitable position measuring sensors may use any suitable position measuring technology. Suitable position measuring technologies include, for example, optical sensors, x-ray sensors, electron beam sensors, neutron beam sensors, atomic force microscopy sensors and acoustic sensors (for example using pump probe techniques). It will be appreciated that the offset parameter and the second position may be determined using different position measuring sensors, which may use the same or different position measuring techniques.

The offset parameter may be determined using a first measurement apparatus and the second position is determined using a second measurement apparatus, the second measurement apparatus being different to the first measurement apparatus.

The first position may represent a more accurate determination of a position indicative of the position of the feature than the second position.

This may allow a more accurate position measurement to be determined within a second apparatus (for example a lithographic apparatus) using a less accurate measurement technique (in combination with the previously determined offset parameter).

The feature may disposed below a surface of the object and at least a portion of the object between the feature and the surface may be opaque, the first position may be a position of the feature and the second position may be a position of a residual topography formed by deposition of one or more process layers over the feature.

With such an arrangement the first technique, by which the first position may be determined, may comprise a pump probe technique. It will be appreciated that the feature may be generally of the form of a reflective diffraction grating, comprising a series of lines and spaces. As one or more process layers are deposited over such a structure, the surface of these process layers may have a residual topography due to the underlying periodic structure of the feature. For example, the residual topography may be a smaller amplitude, distorted version of the underlying feature but may also be periodic and have substantially the same pitch as the underlying feature. It will be appreciated that this is what is meant here by a residual topography formed by deposition of one or more process layers over the feature.

In such embodiments, the first and second positions may both be considered to be positions of the feature (although as determined by different techniques). For such embodiments, the offset parameter may be significantly smaller than a dimension of the feature, and may for example be smaller than a pitch of the feature. The feature may be an alignment mark with a pitch of the order of 2 μm. Over such distance scales deformations of the object (for example a silicon wafer with a diameter of the order of 300 mm) may be insignificant.

The offset parameter may at least partially correspond to a position error caused by any of the following: an alignment grating asymmetry, a layer thickness variation or a residual surface topography.

The offset parameter may be determined using a first range of wavelengths and the second position may be determined using a second range of wavelengths, the first range of wavelengths being greater than the second range of wavelengths.

For example, both the offset parameter and the second positon may be determined using optical sensors. An increased range of wavelengths in the illumination beam may increase the robustness of the measurement.

The offset parameter may be determined using a first illumination mode and the second position may be determined using a second illumination mode.

For example, the first technique, by which the first position may be determined, may use off-axis illumination modes which allow a reduced pitch of alignment mark for greater accuracy. Such techniques are discussed in US 2015/109624. By off-axis illumination, it is meant that the illumination source is confined to a peripheral portion of the pupil plane. Confining the illumination to an extreme periphery of the pupil reduces the smallest possible pitch of the alignment mark from substantially $\lambda/NA$ to substantially $\lambda/2NA$, where $\lambda$ is the wavelength of radiation used, and NA is the numerical aperture of an objective lens of the instrument (e.g. the alignment sensor or more generally the position measuring apparatus).

The offset parameter may be determined using a first illumination polarization state and the second position may be determined using a second polarization state.

The first position may be a position of the feature and the second position may be a position of a second feature.

For example, the second feature may be relatively close to the feature. For such embodiments, the offset parameter is of the order of the separation between the two features. For a sufficiently small distance between the two features, deformations of the object (for example a silicon wafer with a diameter of the order of 300 mm) may be insignificant. Therefore, the offset parameter may be substantially independent of the configuration of the object (as may be dependent on any deformation of the object that may be caused, for example, by clamping of the object to a support).

Such embodiments may allow the position of a feature to be determined inside a lithographic apparatus using a position measurement system (for example an alignment sensor) that cannot resolve the feature (but which can resolve the second, nearby feature). Advantageously, this allows the size of the feature to be reduced. In turn, this may allow for features to be placed in a greater range of positions on the object. For example, typically alignment marks for lithography are located on silicon wafers in scribe lines disposed between adjacent dies. However, if the marks can be reduced in size sufficiently, it may be acceptable to provide marks within the dies themselves. The feature may be disposed within a die and the second feature may be disposed in an adjacent scribe line.

A distance between the feature and the second feature may be less than 10% of a dimension of the object.

For example, the feature may be a μDBO (micro diffraction based overlay) mark disposed within a die of a silicon wafer and the second feature may be an alignment mark disposed in an adjacent scribe line. A silicon wafer may, for example, have a diameter of the order of 300 mm. A typical field dimension (i.e. the dimension of a target region of the silicon wafer that is exposed during a single exposure) may be of the order of 30 mm. Each such field or target region may correspond to a single die. Alternatively, each such field or target region may correspond to a plurality of dies, with the typical dimension of each die being of the order of, for example ½ or ⅓ of the dimension of the field.

It will be appreciated that the maximum distance that a feature disposed within a die can be from the nearest scribe line is ½ of the dimension of the die. In some embodiments, a distance between the feature and the second feature may be less than 5% of a dimension of the object.

In some embodiments, a distance between the feature and the second feature may be less than 1% of a dimension of the object. For a silicon wafer of diameter 300 mm, this corresponds to a distance of the order of 3 mm. This may be approximately equal to a typical spacing of burls on a wafer table and therefore corresponds to a highest spatial frequency of random wafer table clamping deformations.

The offset parameter may be determined directly. It will be appreciated that where the offset parameter is determined directly the determination of the offset parameter does not involve the determinations of the first and second positions. For example, the offset parameter may be determined suing an overlay tool.

Alternatively, the offset parameter may be determined indirectly.

The offset parameter may be determined by first determining the first position and the second position and subsequently determining the offset parameter from the first and second positions of the feature.

It will be appreciated that the offset parameter may be determined in a first apparatus and the second position may be determined in a second apparatus and that, in general, the configuration of the object may differ in the first and second apparatus. Therefore, for embodiments wherein the offset parameter is determined by first determining the first and second positions and then subsequently determining the offset parameter, these first and second positions (which are determined in a first apparatus) will, in general, differ from the first and second positions which are determined in the second apparatus.

The offset parameter may be at least partially calculated so as to correct for process variations.

Such calculations may take into known process variations (for example layer thickness variations, asymmetries etc.), which may be determined (for example by one or more measurements). Process variations such as, for example, layer thickness variations and asymmetries can give rise to alignment measurement errors. For example the second position as determined within a lithographic apparatus may suffer from such a measurement error. However, if the process variations are known (for example measured using separate metrology apparatus), an offset parameter that will at least partially correct for these errors can be determined.

The offset parameter may be determined using a first spatial sampling and the second position is determined using a second spatial sampling.

For example, the spatial sampling of the offset parameter (which is a relative position) may be less dense that the spatial sampling of the second position. In general, depending on the level of distortion of the object (for example caused by clamping the object, which may be a silicon wafer, to a support), a certain number and distribution of features may be provided over the surface of the object. A second position may be determined in a second apparatus (for example within a lithographic apparatus) for each of these features. Therefore, the number and distribution of features provided over the surface of the object may set the spatial sampling of the features in the second apparatus. It may be that the effect that gives rise to a non-zero offset parameter varies relatively slowly over the surface of the object. This effect could be, for example, an alignment grating asymmetry, a layer thickness variation or a residual surface topography. If this is the case then a relatively sparse sampling of the object to measure the offset parameter for only some of the features, for example in a first apparatus, may be sufficient to fully characterize the offset parameters for all features over the whole object.

Determining the second position may comprise: irradiating the object in the vicinity of the feature with measurement radiation; receiving at least a portion of the measurement radiation scattered from the object; and determining the second position from at least a portion of the measurement radiation scattered from object.

It will be appreciated that the feature may be of the form of a reflective diffraction grating and the measurement radiation scattered from the object may comprise a plurality of diffraction orders. The at least a portion of the measurement radiation scattered from the object may comprise at least some of these diffraction orders. The number of diffraction orders that form part of the at least a portion of the measurement radiation scattered from object that is used to determine the second position may be dependent on a number of factors. Such factors include, for example, a pitch of the feature, the wavelength of the measurement radiation and a numerical aperture of an optical system arranged to capture the at least a portion of the measurement radiation scattered from object.

Determining the second position from at least a portion of the measurement radiation scattered from object may be achieved by interfering conjugate diffraction orders with each other. It will be appreciated that by conjugate diffraction orders it is meant the ±nth order diffraction beams. This may be achieved by: splitting the field into two portions (for example using a polarizing beam splitter); rotating the two portions relative to each other by 180°; and then superimposing the two portions such that they interfere with each other. This may be achieved using a self-referencing interferometer of the type described in U.S. Pat. No. 6,961,116.

According to a second aspect of the invention there is provided an apparatus comprising: a substrate support for supporting an object having a feature; and a measurement system operable to determine an offset parameter, the offset parameter being a measure of a difference in: a first position that is indicative of the position of the feature; and a second position that is indicative of the position of the feature.

The object may be a silicon wafer and the feature may be an alignment mark.

The apparatus according to the second aspect of the invention is suitable for carrying out part of the method according to the first aspect of the invention. The apparatus according to the second aspect of the invention may be a metrology apparatus, which may be separate from an associated lithographic apparatus.

In some embodiments, the first and second positions may both be positions of the feature (although may, for example, be determined by different techniques). For such embodiments, the offset parameter may be significantly smaller than a dimension of the feature, and may for example be smaller than a pitch of the feature. In other embodiments, the first position may be a position of the feature and the second position may be a position of another, relatively close feature. For such embodiments, the offset parameter is of the order of the separation between the two features.

The offset parameter is a measure of a difference in: a first position that is indicative of the position of the feature and as can be determined using a first technique; and a second position that is indicative of the position of the feature and as can be determined using a second technique. However, it will be appreciated that the measurement system may be operable to determine the offset parameter directly. That is, in at least some embodiments, it may be that the determination of the offset parameter does not involve the determinations of the first and second positions. Alternatively, the measurement system may be operable to determine the offset parameter by first determining the first and second positions and then subsequently determining the offset parameter.

The apparatus according to the second aspect of the invention may use any suitable position measuring technology. Suitable position measuring technologies include, for example, optical sensors, x-ray sensors, electron beam sensors, neutron beam sensors, atomic force microscopy sensors and acoustic sensors (for example using pump probe techniques).

The apparatus may further comprise: a radiation system operable to irradiate the object with measurement radiation; and the measurement system may be operable to receive at least a portion of the measurement radiation scattered from the object and further operable to determine the offset parameter at least partially from at least a portion of the measurement radiation scattered from the object.

The radiation system may be further operable to irradiate the object with pump radiation so as to produce a mechanical response in the object.

Such an apparatus may be operable to operate in a first operational mode and a second operational mode, as now discussed. In the first operational mode, the measurement system may be operable to determine the offset parameter using the measurement radiation alone. In the second operational mode, the apparatus may be operable to determine the offset parameter using both the pump radiation and the measurement radiation as a pump-probe arrangement. First the pump radiation is used to produce a mechanical response in the object. The mechanical response may, for example, be a mechanical wave. It will be appreciated that such mechanical waves may comprise acoustic waves or any other propagation of heat such as, for example, diffusion of free electrons. The mechanical wave generated by the pump radiation may propagate through the object and a portion of it may be scattered by the feature and propagate back to the surface. Subsequently, the measurement radiation is used to probe the surface of the object so as to indirectly determine one or more characteristics of the feature.

Such an apparatus may be used when the feature is disposed below a surface of the object and wherein at least a portion of the object between the feature and the surface is opaque. The first operational mode may be used to determine the second position, which may be a position of a residual topography formed by deposition of one or more process layers over the feature. The second operational mode may be used to determine the offset parameter directly. Alternatively, second operational mode may be used to determine the first position, which may be a position of the feature as determined using a pump and probe method, and the offset parameter may be determined from the first and second positions.

The radiation system may be operable to irradiate the object with measurement radiation having at least a first range of wavelengths or a second range of wavelengths. The first position may be a position of the feature that may be determined using a first range of wavelengths. The second position may be a position of the feature that may be determined using a second range of wavelengths. The offset parameter may be determined using the second range of wavelengths. The first range of wavelengths being greater than the second range of wavelengths.

An increased range of wavelengths in the illumination beam may increase the robustness of the measurement.

The radiation system may be operable to irradiate the object with measurement radiation having at least a first illumination mode or a second illumination mode. The first position may be a position of the feature that may be determined using a first illumination mode. The second position may be a position of the feature that may be determined using a second illumination mode. The offset parameter may be determined using the second illumination mode.

The radiation system may be operable to irradiate the object with measurement radiation having at least a first illumination polarization state or a second illumination polarization state. The first position may be a position of the feature that may be determined using a first illumination polarization state. The second position may be a position of the feature that may be determined using a second illumination polarization state. The offset parameter may be determined using the second illumination polarization state.

The first position may be a position of the feature and the second position may be a position of a second feature.

The measurement system may be operable to determine the offset parameter directly.

Alternatively, the measurement system may be operable to determine the offset parameter indirectly.

According to a third aspect of the invention there is provided an apparatus comprising: a substrate support for supporting an object having a feature; and a measurement system operable to determine: a second position that is indicative of the position of the feature; and a first position that is indicative of the position of the feature from the second position and a offset parameter, wherein the offset parameter is a measure of a difference in: a first position that is indicative of the position of the feature; and a second position that is indicative of the position of the feature.

The object may be a silicon wafer and the feature may be an alignment mark.

The apparatus according to the third aspect of the invention is suitable for carrying out part of the method according to the first aspect of the invention. The apparatus according to the third aspect of the invention may be a lithographic apparatus.

The apparatus according to the third aspect of the invention may use any suitable position measuring technology. Suitable position measuring technologies include, for example, optical sensors, x-ray sensors, electron beam sensors, neutron beam sensors, atomic force microscopy sensors and acoustic sensors (for example using pump probe techniques).

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable minor array and a programmable LCD array.

Figure 1:
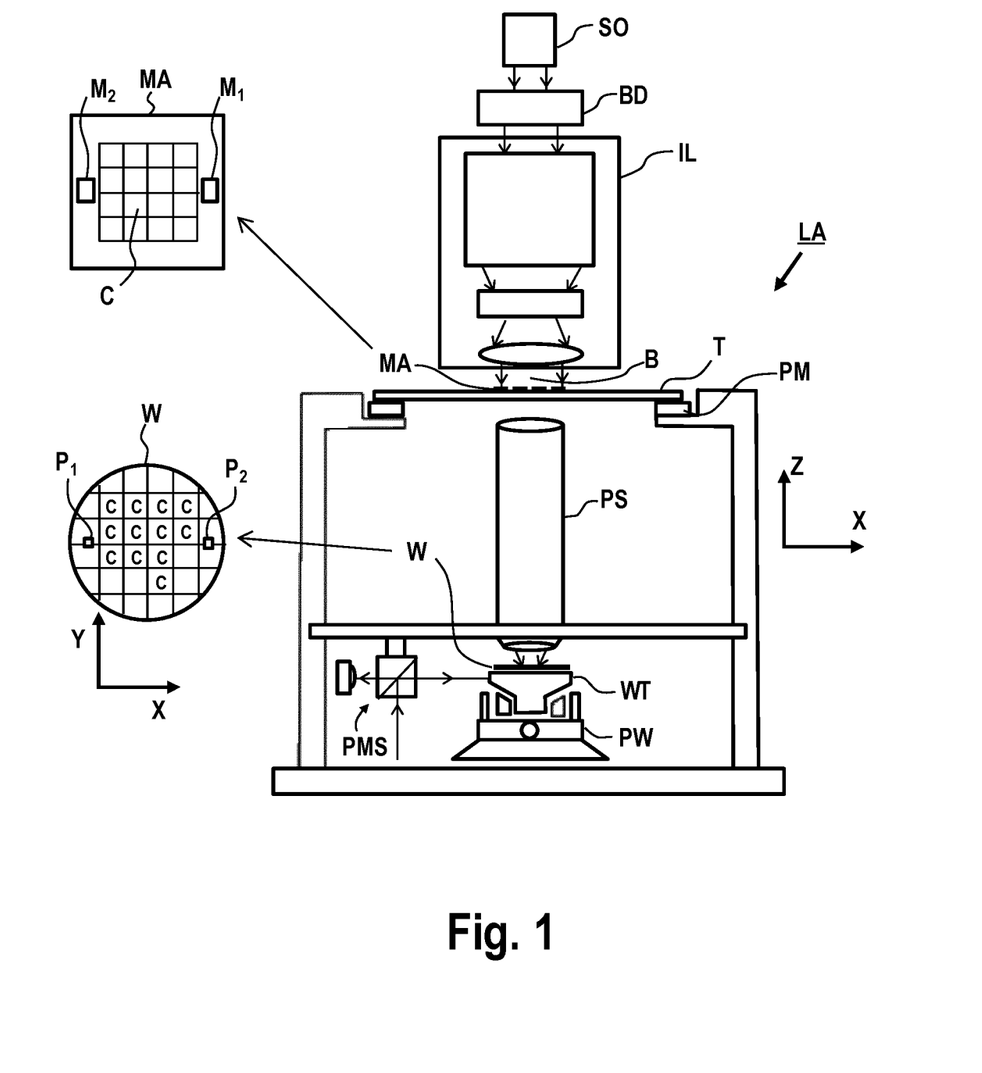
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the x axis, or along the y axis (which is oriented substantially perpendicular to the x axis). A mark comprising bars that are arranged at +45 degrees and/or −45 degrees with respect to both the x- and y-axes allows for a combined x- and y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 2:
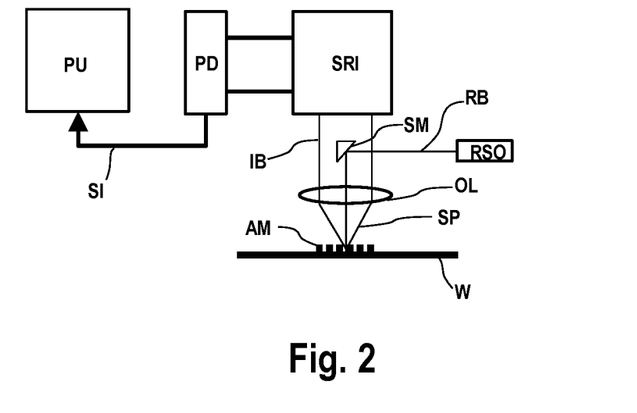
FIG. 2 is a schematic block diagram of an embodiment of a known alignment sensor.

FIG. 2 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

A general method of determining a position of a mark on an object according to an embodiment of the invention is now described with reference to FIG. 3. As indicated by step 10, first an offset parameter $\Delta x$ is determined. The offset parameter $\Delta x$ is a measure of a difference in: a first position $x_1$ that is indicative of the position of the mark and as can be determined using a first technique; and a second position $x_2$ that is indicative of the position of the mark and as can be determined using a second technique.

Next, at step 20 a second position $x_2$ is determined using the second technique. Finally, at step 30 a first position $x_1$ is determined from the second position $x_2$ and the offset parameter $\Delta x$. The position of the mark as determined by this method is the determined first position $x_1$.

As will be discussed further below, the offset parameter $\Delta x$ may be determined (step 10) in a first apparatus and the second position $x_2$ may be determined (step 20) in a second, different apparatus. For example, the offset parameter $\Delta x$ may be determined in a first metrology apparatus and the second position $x_2$ may be determined using a position measurement apparatus (for example an alignment sensor) within a lithographic apparatus.

It will be appreciated that the first and second positions $x_1$, $x_2$ which are indicative of the position of the mark are absolute positions, for example relative to a reference position, as determined using two different techniques. Therefore, the first and second positions $x_1$, $x_2$ are in general dependent on a configuration of the object (for example a substrate W). Any deformation of the object may alter the configuration of the object and, in turn may alter the first and second positions $x_1$, $x_2$. Deformation of the object may occur by, for example, clamping of the object to a support (for example a substrate table WT) and/or heating of the object. It will be appreciated that the reference position relative to which the first and second positions $x_1$, $x_2$ are defined may be a position on the object or, alternatively, may be a position on a support for the object, such as a substrate table WT. It will be further appreciated that any deformation of the object over the distance between the reference position and the first and second positions will affect the determination of the first and second positions $x_1$, $x_2$.

In contrast, the offset parameter $\Delta x$ is a relative position, being a measure of a difference in a first position that is indicative of the position of the mark and as can be determined using a first technique and a second position that is indicative of the position of the mark as can be determined using a second technique. Therefore, although the offset parameter is in principle dependent on the configuration of the object (i.e. any deformations of the object), it is only dependent on deformations of the object over a distance scale of the offset parameter. In practice, the first and second positions may be sufficiently close that the offset parameter is sufficiently small such that over such distance scales deformations of the object may be insignificant. For example, in some embodiments, the first and second positions may both be positions of the mark (although as determined by different techniques). For such embodiments, the offset parameter may be significantly smaller than a dimension of the mark, and may for example be smaller than a pitch of the mark. The mark may be an alignment mark with a pitch of the order of 2 µm. Over such distance scales deformations of the object (for example a silicon wafer with a diameter of the order of 300 mm) may be insignificant. In other embodiments, the first position may be a position of the mark and the second position may be a position of another, relatively close mark. For such embodiments, the offset parameter is of the order of the separation between the two marks. For a sufficiently small distance between the two marks, deformations of the object (for example a silicon wafer with a diameter of the order of 300 mm) may be insignificant. Therefore, the offset parameter may be substantially independent of the configuration of the object (as may be dependent on any deformation of the object that may be caused, for example, by clamping of the object to a support).

Figure 3:
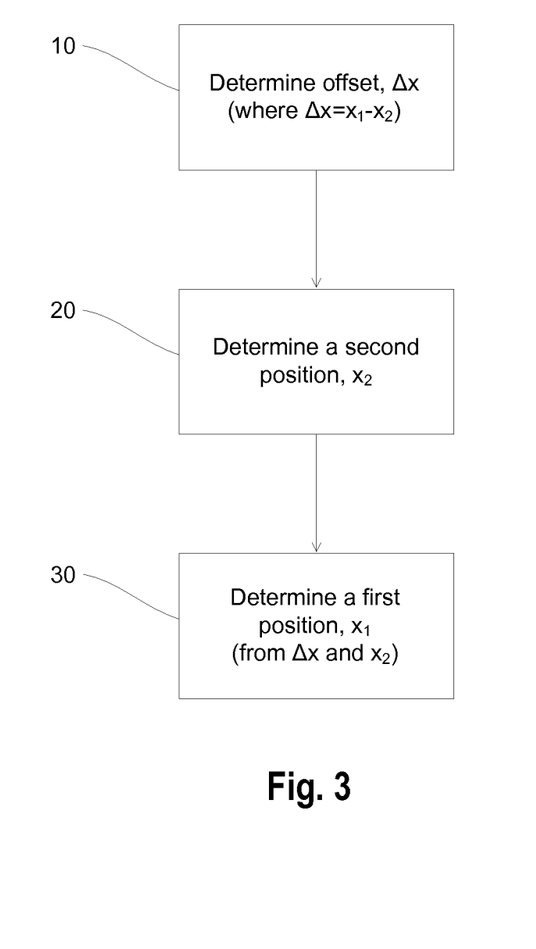
FIG. 3 is a schematic block diagram of an embodiment of a method of determining a position of a mark on an object according to an embodiment of the invention.

The method shown schematically in FIG. 3 is advantageous because, since the offset parameter $\Delta x$ is a relative position (and therefore may be substantially independent of the configuration or deformation of the object), the offset parameter $\Delta x$ can be determined in a first apparatus and the second position $x_2$ may be determined in a second, different apparatus. For example, the offset parameter Δx may be determined in a first metrology apparatus and the second position $x_2$ may be determined using a position measurement apparatus (for example an alignment sensor) within a lithographic apparatus. This ability to split a position measurement into two parts, which can be determined by different apparatuses is counter-intuitive since, as will be appreciated by the skilled person, each apparatus may clamp the object in a different way to a different support and will therefore, in general, cause a different configuration or deformation of the object.

Furthermore, this ability to split a position measurement into two parts, which can be determined by different apparatuses, may allow a more accurate position measurement to be determined within a second apparatus (for example a lithographic apparatus) using a less accurate measurement technique (in combination with the previously determined offset parameter Δx).

Additionally or alternatively, it may allow the position of a mark to be determined inside a lithographic apparatus LA using a position measurement system (for example an alignment sensor) that cannot resolve the mark (but which can resolve another, nearby mark). Advantageously, this allows the size of marks to be reduced. In turn, this may allow for marks to be placed in a greater range of positions on the object. For example, typically alignment marks for lithography are located on silicon wafers in scribe lines disposed between adjacent dies (for example in scribe lines between adjacent target regions C, see FIG. 1). However, if the marks can be reduced in size sufficiently, it may be acceptable to provide marks within the dies themselves.

There have been a number of recent proposals for increased accuracy of alignment mark measurement. However, such proposals typically require more apparatus and physically take up more space. It may be that, unless lithography apparatus LA are re-designed, there is a limit to the amount of space that is available for metrology systems such as alignment sensors. The method shown schematically in FIG. 3 is advantageous because it allows the additional apparatus that is associated with improved alignment measurements to be housed in a different apparatus such that the lithographic apparatus does not need to be re-designed but does benefit from the improved alignment measurements.

The offset parameter Δx is a measure of a difference in: a first position $x_1$ that is indicative of the position of the mark and as can be determined using a first technique; and a second position $x_2$ that is indicative of the position of the mark and as can be determined using a second technique. However, it will be appreciated that, in step 10 of the above-described method, the offset parameter Δx may be determined directly. That is, in at least some embodiments, the determination of the offset parameter Δx does not involve the determinations of the first and second positions $x_1$, $x_2$.

Alternatively, the offset parameter Δx may be determined by first determining the first and second positions $x_1$, $x_2$ and then subsequently determining the offset parameter Δx. As previously explained, steps 10 and 20 of the method may be carried out in different apparatus, in which the configuration of the object (for example substrate W) may differ. Furthermore, it will be appreciated that, in general, the first and second positions $x_1$, $x_2$ are dependent on the configuration of the object. Therefore, for embodiments wherein the offset parameter Δx is determined (at step 10) by first determining the first and second positions $x_1$, $x_2$ and then subsequently determining the offset parameter Δx, these first and second positions $x_1$, $x_2$ (which are determined in a first apparatus) will, in general, differ from the first and second positions $x_1$, $x_2$ which are determined in the second apparatus (at steps 20 and 30). For example, at step 10 a first set of first and second positions $x_1'$, $x_2'$ may be determined and the offset parameter Δx may be determined therefrom (for example, $\Delta x = x_1' - x_2'$). At steps 20 and 30, a different set of first and second positions $x_1$, $x_2$ may be determined: first the second position $x_2$ is determined (for example using a measurement apparatus) and then the first position $x_1$ is determined from the second position $x_2$ and the offset parameter Δx (for example, $x_1 = \Delta x - x_2$).

It will be appreciated that the offset parameter Δx (step 10) and/or the second position $x_2$ (step 20) may be determined using apparatus that is generally of the form of the alignment sensor AS shown in FIG. 2 (and which is described, for example, in U.S. Pat. No. 6,961,116). Accordingly, determining the offset parameter Δx (step 10) and/or the second position $x_2$ (step 20) may comprise irradiating the substrate W in the vicinity of the mark AM with measurement radiation RB, receiving at least a portion IB of the measurement radiation RB scattered from the substrate W; and determining the offset parameter Δx or the second position $x_2$ therefrom.

It will be appreciated that the mark AM may be of the form of a reflective diffraction grating and the measurement radiation IB scattered from the substrate W may comprise a plurality of diffraction orders. The measurement radiation scattered from the substrate W may comprise at least some of these diffraction orders. The number of diffraction orders that form part of the measurement radiation scattered from substrate W that is used to determine the offset parameter Δx or second position $x_2$ may be dependent on a number of factors. Such factors include, for example, a pitch of the mark, the wavelength of the measurement radiation RB and a numerical aperture of an optical system (for example the objective lens OL) arranged to receive the measurement radiation scattered from the substrate W.

Determining the offset parameter Δx or the second position from a portion of the measurement radiation scattered from the substrate W may be achieved by interfering conjugate diffraction orders with each other. It will be appreciated that by conjugate diffraction orders it is meant the ±nth order diffraction beams. This may be achieved by: splitting the field into two portions (for example using a polarizing beam splitter); rotating the two portions relative to each other by 180°; and then superimposing the two portions such that they interfere with each other. This may be achieved using a self-referencing interferometer of the type described in U.S. Pat. No. 6,961,116.

Some specific embodiments of the general method described above with reference to FIG. 2 are now described.

In some embodiments, the first technique may be more accurate than the second technique and therefore the first position $x_1$ may represent a more accurate determination of a position indicative of the position of the mark than the second position $x_2$. This may allow a more accurate position measurement to be determined within a second apparatus (for example a lithographic apparatus LA) using a less accurate measurement technique (in combination with the previously determined offset parameter Δx). For example, the offset parameter Δx may be determined using more accurate techniques, such as, for example: pump probe techniques (which can allow positions of alignment marks disposed beneath opaque process layers); measurements using a greater range of wavelengths; and measurements using more optimized illumination modes.

Figure 4:
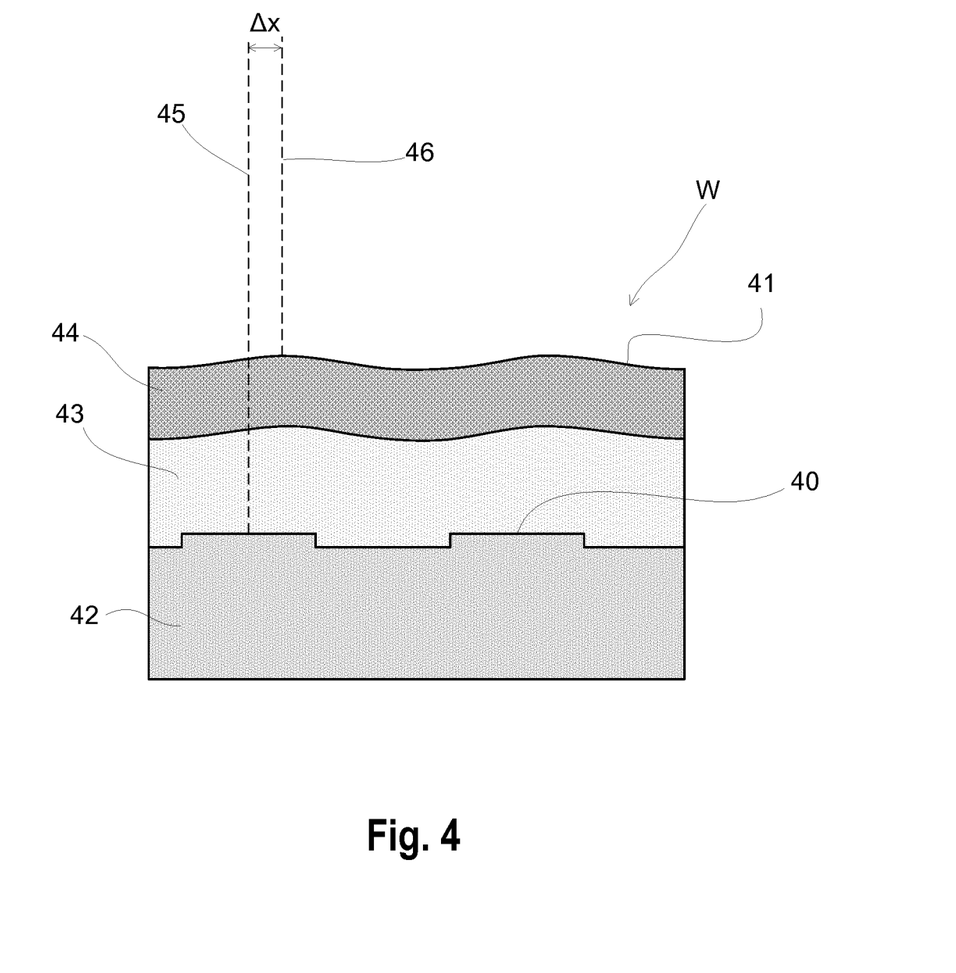
FIG. 4 is a schematic representation of a cross section of a portion of a substrate having a mark (a reflective diffraction grating) and two process layers formed over the mark.

FIG. 4 is a schematic representation of a cross section of a portion of a substrate W wherein a mark 40 is disposed below a surface 41 of the substrate W and at least a portion of the substrate W between the mark 40 and the surface 41 is opaque. In the example shown in FIG. 4, the substrate W comprises a first layer 42, a second layer 43 and a third layer 44. The mark 40, which is of the form of a reflective diffraction grating, is formed in the first layer 42. The second and third layers represent two process layers that have been formed over the mark 40, one of which (for example the third layer 44) is opaque. The surface 41 of the substrate is defined by the third layer 44.

In this embodiment, the first position x1 is a true position of the mark 40 and is represented by a dashed line 45. The second position x2 is a position of a residual topography formed by deposition of one or more process layers over the mark 40 and is represented by a dashed line 46. It will be appreciated that the mark 40 may be generally of the form of a reflective diffraction grating, comprising a series of lines and spaces. As one or more process layers (for example the second and third layers 43, 44) are deposited over such a structure, the surface of these process layers may have a residual topography due to the underlying periodic structure of the mark. For example, the residual topography may be a smaller amplitude, distorted version of the underlying mark but may also be periodic and have substantially the same pitch as the underlying mark 40. It will be appreciated that this is what is meant here by a residual topography formed by deposition of one or more process layers over the mark 40. This residual topography is indicated schematically on surface 41 and it will be appreciated that the amplitude of this residual topography has been exaggerated for clarity of understanding of the principle.

The first position $x_1$ (which is the true position of the mark 40) is represented by a dashed line 45, which indicates the position of a center of a peak in the reflective diffraction grating of the mark 40. The second position $x_2$ (which is the position of the residual topography formed by deposition of one or more process layers over the mark 40) is represented by a dashed line 46, which indicates the position of a center of a peak in the residual topography of surface 41. As can be seen from the two dashed lines 45, 46 the first and second positions $x_1$, $x_2$ are different, the position of the residual topography on surface 41 being shifted relative to the true position of the mark 40 by an offset parameter Δx.

For such embodiments having a mark 40 disposed beneath an opaque layer 44, the apparatus which is used to determine the offset parameter Δx (step 10) is operable to use a suitable technique for determining the position of a mark 40 despite it being disposed beneath an opaque layer 44. For example, the apparatus which is used to determine the offset parameter Δx (step 10) may be generally of the form of the alignment sensor AS shown in FIG. 2 but in addition having a radiation system that is operable to irradiate the substrate W with pump radiation so as to produce a mechanical response in the object. Alternatively, the apparatus which is used to determine the offset parameter Δx (step 10) may be operable to implement any of the following: use a transducer (for example a piezoelectric device) to induce mechanical waves (either from the top or the bottom of the substrate W); use atomic force microscopy (AFM) to measure the acoustic deformations (excited either using pump radiation or a transducer); or to optically measure the mark 40 from the bottom side of the substrate W (for example using infrared radiation).

An apparatus generally of the form of the alignment sensor AS shown in FIG. 2 but in addition having a radiation system that is operable to irradiate the substrate W with pump radiation (or a having transducer) so as to produce a mechanical response in the object may be operable to operate in a first operational mode, wherein the apparatus may be operable to determine the offset parameter Δx using both the pump radiation and the measurement radiation as a pump-probe arrangement. First the pump radiation is used to produce a mechanical response in the substrate W. The mechanical response may, for example, be a mechanical wave. It will be appreciated that such mechanical waves may comprise acoustic waves or any other propagation of heat such as, for example, diffusion of free electrons. The mechanical wave generated by the pump radiation may propagate through the substrate W and a portion of it may be scattered by the mark 40 and propagate back to the surface 41. Subsequently, the measurement radiation is used to probe the surface 41 of the substrate W so as to indirectly determine one or more characteristics of the mark 40.

It will be appreciated that when operating in the first mode (as a pump probe arrangement), the measurement radiation which scatters from the surface 41 will, in general, be probing a combination of the residual topography and an additional time dependent signal formed by a reflection of a mechanical wave generated by the pump radiation. However, it will also be appreciated that it is possible to determine the information regarding the true position of the mark 40 from the scattered measurement radiation. This may involve making a separate measurement wherein the measurement radiation scatters from the residual topography alone. For this purpose, the apparatus may be operable to operate in second operational mode in which the pump radiation is not used and the measurement radiation is used to probe the surface 41 of the substrate W only. The second operational mode may be used to determine the second position $x_2$, which may be the position of a residual topography formed by deposition of one or more process layers 43, 44 over the mark 40. The first operational mode may be used to determine the offset parameter directly Δx. Alternatively, first operational mode may be used to determine the first position $x_1$ (as indicated by line 45) and the offset parameter Δx may be determined from the first and second positions $x_1$, $x_2$.

In such embodiments, the first and second positions $x_1$, $x_2$ may both be considered to be positions of the mark 40 (although as determined by different techniques). For such embodiments, the offset parameter Δx may be significantly smaller than a dimension of the mark 40, and may for example be smaller than a pitch of the mark 40. The mark 40 may be an alignment mark with a pitch of the order of 2 µm. Over such distance scales deformations of the substrate W (for example a silicon wafer with a diameter of the order of 300 mm) may be insignificant.

For such embodiments having a mark 40 disposed beneath an opaque layer 44, the apparatus which is used to determine the second position $x_2$ (step 20) may be generally of the form of the alignment sensor AS shown in FIG. 2 (having no additional radiation system that is operable to irradiate the substrate with pump radiation). For example, step 20 may be performed within a lithographic apparatus LA. The embodiment of the method of FIG. 3 as applied to the arrangement shown in FIG. 4 is advantageous since it allows a lithographic apparatus LA to determine a position of an alignment mark 40 that is disposed below an opaque layer 44 without a pump probe apparatus. This is achieved by first using a separate pump probe apparatus to determine the offset parameter Δx and then, subsequently, determining the position $x_1$ from the offset parameter $\Delta x$ in combination with the less accurate second position $x_2$.

It will be appreciated that the embodiment shown in FIG. 4 the alignment mark 40 is disposed beneath an opaque layer 44 is just one example where the first position $x_1$ represents a more accurate determination of a position indicative of the position of the mark than the second position $x_2$.

For example, in some embodiments the first position $x_1$ may be a position of the mark that can be determined using a first range of wavelengths and the second position $x_2$ is a position of the mark that can be determined using a second range of wavelengths, the first range of wavelengths being greater than the second range of wavelengths. Additionally or alternatively, in some embodiments the offset parameter $\Delta x$ may be determined using a first range of wavelengths and the second position $x_2$ may be determined using a second range of wavelengths, the first range of wavelengths being greater than the second range of wavelengths. It will be appreciated that an increased range of wavelengths in the illumination beam may increase the robustness of the measurement.

Alternatively or additionally, in some embodiments the first position $x_1$ is a position of the mark that can be determined using a first illumination mode and the second position $x_2$ is a position of the mark that can be determined using a second illumination mode. Additionally or alternatively, in some embodiments the offset parameter $\Delta x$ may be determined using a first illumination mode and the second position $x_2$ may be determined using a second illumination mode. It will be appreciated that as used here illumination mode is intended to mean the range of angles that the measurement radiation illuminates each point on the mark with. For example, the first position $x_1$ and/or the offset parameter $\Delta x$ can be determined using off-axis illumination modes which allow a reduced pitch of alignment mark for greater accuracy. Such techniques are discussed in US 2015/109624. By off-axis illumination, it is meant that the illumination source is confined to a peripheral portion of the pupil plane. Confining the illumination to an extreme periphery of the pupil reduces the smallest possible pitch of the alignment mark from substantially $\lambda/NA$ to substantially $\lambda/2NA$, where $\lambda$ is the wavelength of radiation used, and NA is the numerical aperture of an objective lens of the instrument (e.g. the alignment sensor or more generally the position measuring apparatus). Additionally, the offset parameter $\Delta x$ may be determined in an apparatus having a higher numerical aperture objective (for example a numerical aperture >0.9) than is used in the apparatus which is used to determine the second position $x_2$ at step 20 (which may, for example use a numerical aperture of around 0.7, for example due to spatial constraints within the apparatus). This increase in numerical aperture can further reduce the smallest possible pitch of the alignment mark.

Alternatively or additionally, in some embodiments the first position $x_1$ is a position of the mark that can be determined using a first illumination polarization state and the second position $x_2$ is a position of the mark that can be determined using a second illumination polarization state. Alternatively or additionally, in some embodiments the offset parameter $\Delta x$ may be determined using a first illumination polarization state and the second position $x_2$ may be determined using a second illumination polarization state.

Alternatively, in some embodiments the first position $x_1$ may be a position of the mark and the second position $x_2$ may be a position of a second mark, as now described with reference to FIG. 5.

Figure 5:
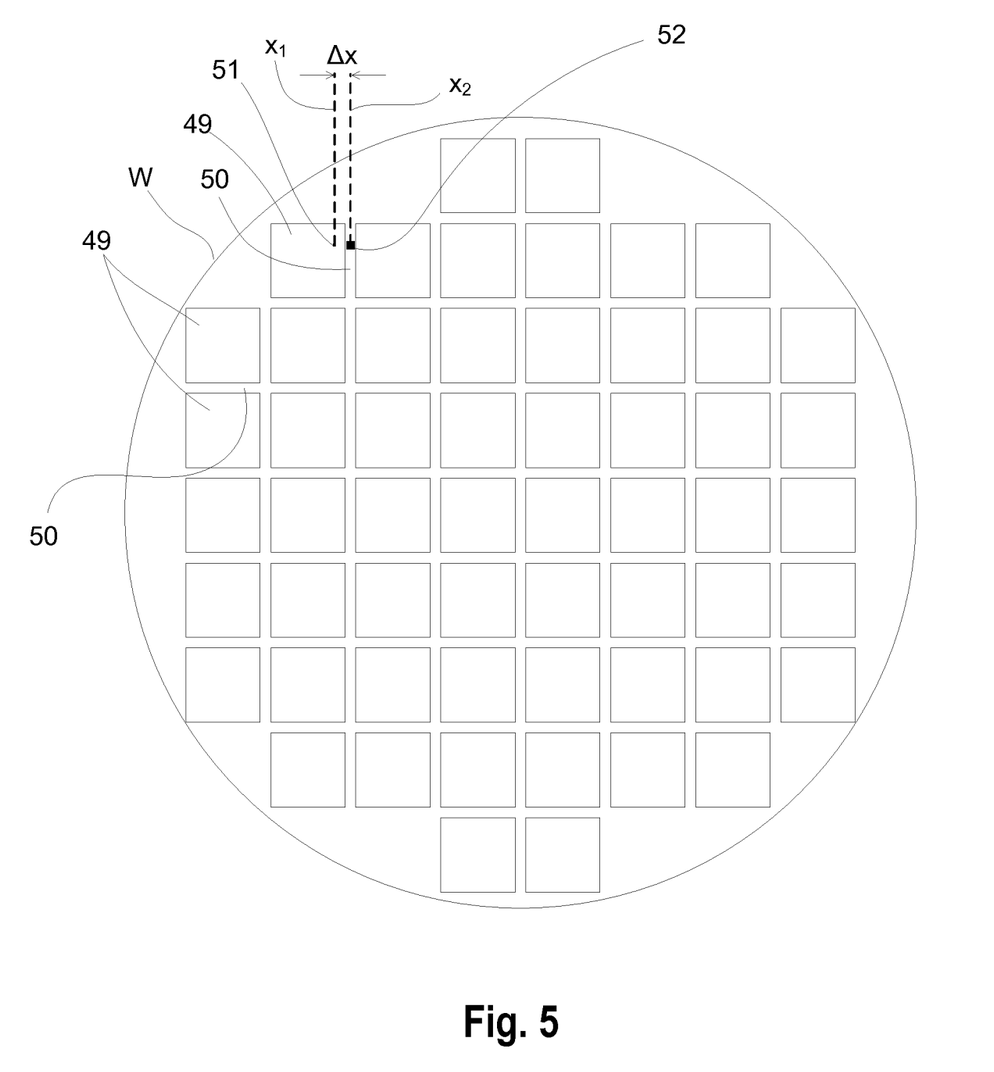
FIG. 5 is a schematic representation of a substrate having a plurality of dies separated by scribe lines, having a first mark, the position of which it is desirable to determine, provided within a target region and a second mark is in an adjacent scribe line.

FIG. 5 is a schematic representation of a substrate W having a plurality of dies 49. Each die 49 may, for example correspond to a single target region C that is exposed during a single exposure process. Alternatively, each die 49 may correspond to a portion of a single target region C that is exposed during a single exposure process (i.e. such that each target region C corresponds to a plurality of dies 49). Alternatively, each die 49 may correspond to a plurality of target region C that are each exposed during a separate exposure process. A gap or scribe line 50 is provided between adjacent dies 49. Typically alignment marks for lithography are located on the substrate W in the scribe lines 50 disposed between adjacent dies 49.

In this embodiment, a mark 51 the position of which it is desirable to determine (for example within a lithographic apparatus LA) is provided within a die 49. The mark 51 may be significantly smaller than a typical alignment mark. The mark 51 may be of the form of a μDBO (micro diffraction based overlay) mark.

A second mark 52 is provided on the substrate W. The second mark 52 is of the form of a typical alignment mark 52 and is provided in a scribe line 50 adjacent to the die 49 within which the mark 51 is provided. The first position $x_1$ is the position of the mark 51 and the second position $x_2$ is the position of the second mark 52. For such embodiments, the offset parameter $\Delta x$ is of the order of the separation between the two marks 51, 52. For a sufficiently small distance between the two marks 51, 52, deformations of the substrate W (for example a silicon wafer with a diameter of the order of 300 mm) may be insignificant. Therefore, the offset parameter $\Delta x$ may be substantially independent of the configuration of the substrate W as may be dependent on any deformation of the substrate W that may be caused, for example, by clamping of the substrate W to a support (for example substrate table WT).

Such embodiments may allow the position of a mark 51 to be determined inside a lithographic apparatus LA using a position measurement system (for example an alignment sensor) that cannot resolve the mark 51 (but which can resolve the second, nearby mark 52). Advantageously, this allows the size of the mark to be reduced. In turn, this may allow for marks to be placed in a greater range of positions on the substrate W. For example, typically alignment marks for lithography are located on silicon wafers in scribe lines 50 disposed between adjacent dies 49. However, if the marks can be reduced in size sufficiently, it may be acceptable to provide marks within the target regions C themselves. As in the embodiment shown in FIG. 5, the mark 51 may be disposed within a die 49 and the second mark 52 may be disposed in an adjacent scribe line 50.

A silicon wafer may, for example, have a diameter of the order of 300 mm. A typical field dimension (i.e. the dimension of a target region C of the silicon wafer that is exposed during a single exposure) may be of the order of 30 mm. Each such field or target region C may correspond to a single die 49. Alternatively, each such field or target region C may correspond to a plurality of dies 49, with the typical dimension of each die 49 being of the order of, for example ½ or ⅓ of the dimension of the target region C. In general, a distance between the mark 51 and the second mark 52 is less than 10% of a dimension of the substrate W. It will be appreciated that the maximum distance that a mark 51 disposed within a die 49 can be from the nearest scribe line 50 is ½ of the dimension of the die 49. In some embodiments, a distance between the mark 51 and the second mark 52 may be less than 5% of a dimension of the substrate W.

In some embodiments, a distance between the mark 51 and the second mark 52 may be less than 1% of a dimension of the substrate W. For a silicon wafer of diameter 300 mm, this corresponds to a distance of the order of 3 mm. This may be approximately equal to a typical spacing of burls on a wafer table WT and therefore may correspond to a highest spatial frequency of random wafer table clamping deformations.

In some embodiments, the offset parameter $\Delta x$ may be at least partially calculated. Such calculations may take into known process variations (for example layer thickness variations, asymmetries etc.), which may be determined (for example by one or more measurements). Process variations such as, for example, layer thickness variations and asymmetries can give rise to alignment measurement errors. For example the second position $x_2$ as determined within a lithographic apparatus may suffer from such a measurement error. However, if the process variations are known (for example measured using separate metrology apparatus), an offset parameter $\Delta x$ that will at least partially correct for these errors can be calculated.

Alignment grating asymmetry can for example be determined by an alignment sensor (for example of the form shown in FIG. 2) that uses a plurality of different wavelengths of light (because asymmetry induces different alignment offsets for different wavelengths). It can also be determined by measuring the intensity difference between conjugate diffraction orders (for example between ±nth order diffraction orders). Alternatively, asymmetry can be characterized by an apparatus that is operable to measure grating line shapes.

Layer thickness variation can also be measured in a metrology apparatus, for example using an ellipsometer or an acoustic tool (which is operable to measure time delays of acoustic echoes). This information can be used in optical models to calculate e.g. interference inside the substrate W and a resulting shift of the center of gravity of the diffraction orders in the pupil plane of an alignment sensor (for example of the form shown in FIG. 2). Unknown and fluctuating shifts of center of gravity of diffraction orders cause alignment errors due to optical aberrations in the sensor.

A potential problem for using a plurality of wavelengths of light to an alignment sensor inside a lithographic apparatus is that the intensity per wavelength may be decreased so as to prevent heating of damage of the substrate W. As a result, the reproducibility of the alignment performance may be reduced. This is a further advantage of embodiments of the present invention wherein the offset parameter $\Delta x$ is determined within a separate apparatus. In such an apparatus there may be more time available for performing each measurement, which may allow the reproducibility of the alignment performance may be increased, even for a plurality of different wavelengths.

Furthermore, in such an arrangement wherein the offset parameter $\Delta x$ and the second position $x_2$ are determined in separate apparatus, a spatial sampling of the features or marks over the substrate W can be further optimized, as now discussed. For example, in a first apparatus, during determination of the offset parameter $\Delta x$, a spatial sampling of the marks may be matched to the spatial frequencies which give rise to the offset between the first and second positions (for example, grating asymmetry). Similarly, in a second apparatus, during determination of the second position $x_2$, a spatial sampling of the marks may be matched to the spatial frequencies of the deformation of the entire substrate W. Note that this difference in spatial sampling of marks for the determination of the offset parameter $\Delta x$ and the second position $x_2$ can be applied to other embodiments of the present invention (for example for layer thickness variation or for the residual surface topology as discussed above with reference to FIG. 4).

In general, depending on the level of distortion of the substrate W (for example caused by clamping the substrate W to a substrate support WT), a certain number and distribution of marks may be provided over the surface of the substrate W. For example, of the order of 200 marks may be provided over the substrate W. A second position $x_2$ may be determined in a second apparatus (for example within a lithographic apparatus) for each of these mark. Therefore, the number and distribution of marks provided over the surface of the substrate W may set the spatial sampling of the marks in the second apparatus. It may be that the effect that gives rise to a non-zero offset parameter $\Delta x$ varies relatively slowly over the surface of the substrate W. This effect could be, for example, an alignment grating asymmetry, a layer thickness variation or a residual surface topography. If this is the case then a relatively sparse sampling of the substrate W to measure $\Delta x$ for only some of the marks (for example, by measuring only 40 marks) in the first apparatus may be sufficient to fully characterize $\Delta x$ for the whole substrate W. It will be appreciated that these specific numbers merely one illustrative example and that any suitable spatial sampling of marks may be used for the determination of the offset parameter $\Delta x$ and the second position $x_2$.

Although the above-described embodiments make reference to marks and alignment marks it will be appreciated that the above-described methods and apparatus can be applied to any type of feature and process for determining a position of that feature.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media;

optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions.

However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of determining a position of a feature on an object, the method comprising:
   determining an offset parameter, the offset parameter being a measure of a difference between:
      a first position that is indicative of the position of the feature; and
      a second position that is indicative of the position of the feature;
   determining the second position; and
   determining the first position from the second position and the offset parameter,
   wherein the offset parameter is determined using a first technique and the second position is determined using a second technique, the first and second techniques comprising different apparatuses, different operational modes, different wavelength ranges, different illumination modes, different polarization states or different spatial samplings.

2. The method of claim 1, wherein the feature is disposed below a surface of the object and wherein at least a portion of the object between the feature and the surface is opaque, wherein the first position is a position of the feature and wherein the second position is a position of a residual topography formed by deposition of one or more process layers over the feature.

3. The method of claim 1, wherein the offset parameter is determined using a first range of wavelengths and the second position is determined using a second range of wavelengths, the first range of wavelengths being greater than the second range of wavelengths.

4. The method of claim 1, wherein the first position is a position of the feature and wherein the second position is a position of a second feature.

5. The method of claim 1, wherein the offset parameter is determined by first determining the first position and the second position, and subsequently determining the offset parameter from the first and second positions of the feature.

6. The method of claim 1, wherein the offset parameter is at least partially calculated so as to correct for process variations.

7. The method of claim 1, wherein determining the second position comprises:
   irradiating the object in the vicinity of the feature with measurement radiation;
   receiving at least a portion of the measurement radiation scattered from the object; and
   determining the second position from at least a portion of the measurement radiation scattered from object.

8. An apparatus comprising:
   a substrate support for supporting an object having a feature; and
   a measurement system operable to determine an offset parameter, the offset parameter being a measure of a difference between a first position that is indicative of the position of the feature and a second position that is indicative of the position of the feature;
   a radiation system operable to irradiate the object with measurement radiation,
   wherein the measurement system is operable to receive at least a portion of the measurement radiation scattered from the object and is further operable to determine the offset parameter at least partially from at least a portion of the measurement radiation scattered from the object, and
   wherein the measurement system is operable to determine the offset parameter using a first technique and is operable to determine the second position using a second technique, the techniques comprising different apparatuses, different operational modes, different wavelength ranges, different illumination modes, different polarization states or different spatial samplings.

9. The apparatus of claim 8, wherein the radiation system is further operable to irradiate the object with pump radiation so as to produce a mechanical response in the object.

10. The apparatus of claim 8, wherein the radiation system is operable to irradiate the object with measurement radiation having at least a first range of wavelengths or a second range of wavelengths, and wherein the first position is a position of the feature that is determined using a first range of wavelengths and the second position is a position of the feature that is determined using a second range of wavelengths, the first range of wavelengths being greater than the second range of wavelengths.

11. The apparatus of claim 8, wherein the radiation system is configured to irradiate the object with measurement radiation having at least a first illumination mode or a second illumination mode, and wherein the first position is a position of the feature that may be determined using a first illumination mode and the second position is position of the feature that may be determined using a second illumination mode.

12. The apparatus of claim 8, wherein the radiation system is configured to irradiate the object with measurement radiation having at least a first illumination polarization state or a second illumination polarization state, and wherein the first position is a position of the feature that may be determined using a first illumination polarization state and the second position is a position of the feature that may be determined using a second illumination polarization state.

13. An apparatus comprising:
   a substrate support for supporting an object having a feature with a position; and
   a measurement system operable to determine:
      a second position that is indicative of the position of the feature; and
      a first position that is indicative of the position of the feature from the second position and an offset parameter,
      wherein the offset parameter is a measure of a difference between a first position that is indicative of the position of the feature and a second position that is indicative of the position of the feature, and
      wherein the radiation system is configured to irradiate the object with measurement radiation having at least a first range of wavelengths or a second range of wavelengths, and wherein the first position is a position of the feature that is determined using a first range of wavelengths and the second position is a position of the feature that is determined using a second range of wavelengths, the first range of wavelengths being greater than the second range of wavelengths.

\* \* \* \* \*